United States Patent [19]

Shulman

[11] Patent Number: 4,587,484
[45] Date of Patent: May 6, 1986

[54] MERCURY PROBE AND METHOD

[75] Inventor: Carl Shulman, Edgewater, N.J.

[73] Assignee: MSI Electronics Inc., New York, N.Y.

[21] Appl. No.: 541,046

[22] Filed: Oct. 12, 1983

Related U.S. Application Data

[63] Continuation-in-part of Ser. No. 226,357, Jan. 19, 1981, abandoned.

[51] Int. Cl.$^4$ .......................... G01R 1/06; H01R 3/00
[52] U.S. Cl. .............................. 324/158 F; 339/118 R
[58] Field of Search .............. 324/158 F, 158 P, 72.5; 339/117 R, 117 P, 118 R, 118 RY

[56] References Cited

U.S. PATENT DOCUMENTS

| | | | |
|---|---|---|---|
| 3,794,912 | 2/1974 | Severin et al. | 324/158 P X |
| 4,021,735 | 5/1977 | Vieweg-Gutberlet et al. | 324/158 P |
| 4,101,830 | 7/1978 | Grieg | 324/158 P X |
| 4,409,547 | 10/1983 | Lederman | 324/158 P |
| 4,521,730 | 6/1985 | Schulman | 324/158 P X |

Primary Examiner—Stewart J. Levy
Assistant Examiner—Stephen M. Baker

[57] ABSTRACT

The disclosed mercury probe has a mercury reservoir and one or more passages extending from the reservoir to an aperture plate for engaging a test wafer. Dross that tends to form at the wafer-contact end of the mercury passage(s) is removed by returning all of the mercury in the passage(s) into the reservoir, where the dross is captured. Means is provided to introduce air into the passage(s) between the reservoir and the aperture(s) of the aperture plate, for disconnecting the mercury-probe segment(s) of the mercury from the reservoir and, where there are plural mercury-probe segments, for disconnecting them from each other.

6 Claims, 5 Drawing Figures

MERCURY PROBE AND METHOD

This is a continuation-in-part of my application Ser. No. 226,357 filed Jan. 19, 1981, now abandoned.

The present invention relates to mercury-probe test apparatus and a method of its operation. Such test apparatus is widely used for testing semi-conductor wafers, being exemplified in U.S. Pat. Nos. 3,794,912 issued Feb. 26, 1974 to P. J. W. Severin et al, and 4,101,830 issued July 18, 1978 to John H. Greig.

A wafer to be tested is positioned against an aperture plate in such test apparatus and mercury is displaced along a passage into contact with the wafer. In the course of repeated test cycles, bits of dirt tend to accumulate at the contact end of the mercury in the passage, degrading the tests. In order to clear the mercury in the passage of dross, it has been customary to expel some of the mercury, either at intervals or before each test. This involves a separate preparatory operation. Moreover, special care is needed in handling the expelled mercury to avoid the hazard of scattered mercury.

A variety of tests can be performed with mercury probes, each requiring an appropriate number of contacts. Where the tests involve capacitance measurements, the stray capacitance of the test apparatus must be taken into account. In bridge circuits, small values of stray capacitance can be "zeroed out" without appreciably affecting the test accuracy. A large amount of stray capacitance tends to interfere with the test accuracy. The reservoir represents a large contributor to the stray capacitance in apparatus where it remains connected to the wafer-engaging mercury, for example the apparatus shown in the Greig patent mentioned above. The problem is compounded where there are plural mercury-probe contacts each connected to its own mercury reservoir. There, the stray capacitance between reservoirs tends to be especially large.

SUMMARY OF THE INVENTION

The illustrative embodiments of the invention shown in the accompanying drawings and described in detail below incorporate a number of novel features which will be clear from that detailed description below. In one novel aspect, a reservoir of mercury is used in each test cycle to provide the mercury that contacts the test wafer. That mercury is returned to the reservoir after the test. The passage is self-emptying due to gravity and surface tension of the mercury in the passage. Dross that might have been introduced at the test wafer tends to accumulate at the surface of the mercury in the reservoir, where it is captured. Mercury having a fresh surface enters the passages to the contact aperture(s) in each new test cycle.

Mercury-probe test apparatus of the kind just described may have a mercury-filled passage extending from the reservoir to the test aperture(s) in the aperture plate when the mercury makes contact with the test wafer. In such apparatus the reservoir is electrically connected to what may be called the "mercury-probe segment", that is, the mercury in the passage extending to the test aperture. Moreover, with mercury filling the passage, if the passage were divided to form plural mercury-probe contacts, the mercury in the passage would connect those mercury-probe contacts to each other.

In the apparatus detailed below, the mercury in the mercury passage is parted so that the (each) mercury-probe segment becomes insulated from the reservoir. In the described apparatus air is introduced into the mercury passage for separating the (each) mercury probe segment from the rest of the mercury in the system. Where a common reservoir is used for plural mercury-probe contacts, a common air inlet is used in the illustrative apparatus not only for disconnecting the mercury-probe segments from the reservoir but also for disconnecting those segments from each other.

In one sense, the present apparatus represents an improvement over the mercury probe in the Greig patent, supra. The Greig apparatus shifts mercury from the reservoir to contact the test wafer by developing vacuum in the interface between the aperture plate and the test wafer. In the novel illustrative apparatus where vacuum is used in this way and where the reservoir is below the level of that interface, mere opening of an intermediate point in the mercury passage(s) to the atmosphere introduces air and effects disconnection of the (each) mercury probe segment from the mercury filling the passage to the reservoir. If Greig's vacuum were not used and if air pressure were applied to the mercury in the reservoir to shift the mercury along the passage(s) to the mercury-probe segments, air that is introduced under pressure partway along the mercury passage could be provided for disconnecting the mercury-probe segment(s) from the reservoir and from each other. However, use of air under pressure for displacing the mercury can lead to hazardous scattering of the mercury, so that use of vacuum as in Greig and described below is distinctly superior.

The nature of the invention in its various aspects including the foregoing and other objects, advantages and novel features, will be better appreciated on the basis of the accompanying drawings and the detailed description below of several illustrative embodiments.

THE ILLUSTRATIVE EMBODIMENTS

Figure 1:
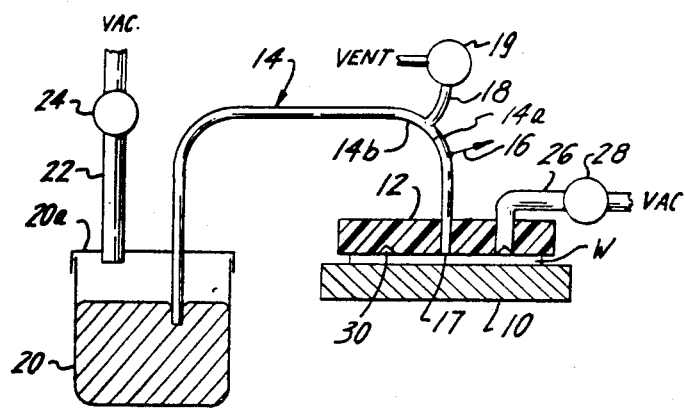
FIG. 1 is a diagrammatic view, partly in vertical cross-section, of mercury-probe apparatus illustrating certain aspects of the invention.
Figure 1A:
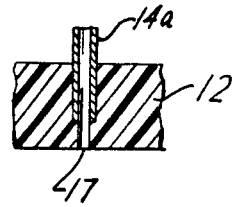
FIGS. 1A and 2A are enlarged cross-sections of portions of FIGS. 1 and 2.

In FIG. 1, a wafer W rests on support 10. For some tests, the material of support 10 (or a large contact area on support 10) is nickel or aluminum or other electrical conductor. Plate 12 of electrical insulation rests on the wafer. A tube 14 provides a passage from reservoir 20 to aperture 17. Tube 14 includes segment 14a that extends into plate 12. Where segment 14a is of insulation, circuit connection 16 to the mercury is made by a wire as of nickel or stainless steel extending through the wall of the tube segment. In a preferred construction, tube segment 14a is of metal such as stainless steel that extends only partway through plate 12 (FIG. 1A) and is aligned with aperture 17. The metal tubing provides the circuit connection to the segment of mercury extending to test aperture 17.

A "T" fitting connects vent line 18 to tube 14. In this way tube 14 is divided into segment 14a and another segment 14b that extends into mercury reservoir 20. Valve 19 is interposed in vent line 18. A vacuum line 22 equipped with valve 24 extends through the sealed cover 20a of the reservoir. Of course, all of the tubing 14a, 14b and 18 that at times contains mercury should be of a material such as plastics, stainless steel or other material that does not form an amalgum. Such materials cause the mercury to form a convex surface, i.e. to bulge into the tubing, when an end of the tubing is immersed in mercury (FIG. 2A).

A vacuum line 26 equipped with valve 28 extends through plate 12 to a circular groove 30 in plate 12 that surrounds aperture 17.

In use of the apparatus, valves 19, 24 and 26 are closed initially. Valve 26 is opened, developing vacuum across the surface of the wafer within groove 30 and drawing mercury from the reservoir into tube 14 and into contact with the surface of wafer W. The opposed surfaces of wafer W and aperture plate 12 are flat and smooth, but vacuum develops rapidly at aperture 17 by virtue of microscopic scratches in the wafer-engaging face of plate 12.

Next, vent valve 19 is opened. The mercury between the "T" fitting and the reservoir and any mercury present in vent line 18 drops back into the reservoir by siphon action, leaving only the limited amount of mercury in tube segment 14a extending into contact with wafer W. This is the "mercury-probe segment" mentioned above. The vacuum in line 26 is maintained, so that atmospheric pressure behind the mercury tends to flatten the meniscus of the mercury at the surface of the wafer. The mercury-probe segment is connected into the test circuit by lead 16. Notably, the large mass of mercury in the reservoir and the mercury previously in tube segment 14b become disconnected from lead 16. In this way, the test circuit is freed of the stray capacitance that would develop but for the disconnection. It is understood that tube 14b is of insulation, where such disconnection is to occur.

After the tests are completed and before plate 12 is lifted to enable the test wafer to be removed, vent valve 19 is closed, vacuum valve 26 is closed (so that aperture 17 shifts to atmospheric pressure) and vacuum valve 24 is opened. The vacuum that develops in reservoir 20 withdraws the air in segment 14b and then transfers the mercury in tube segment 14a into the reservoir. Obviously—and in ordinary practice—tube 14 is not of such gross diameter as to enable air from the wafer surface to bubble past the mercury that is to be lifted toward the reservoir. All of the mercury in tubing 14 is returned to the reservoir and dross that may have entered aperture 17 is drawn into the reservoir where it rises to the surface. In the ensuing test operation, fresh mercury enters tubing 14, thus tending to provide a clean mercury probe contact automatically.

After all the mercury in tubing 14 has been returned to the reservoir, the vacuum should be shut off. Otherwise, air from tubing 14 bubbles through the mercury in the reservoir, producing turbulence. This effect is minimized by using a weak vacuum in line 22. Also, at the cost of added complexity, the returning mercury can be directed to the reservoir via a different line through cover 20a that would terminate above the surface of the mercury.

Experience shows that, for consistent results in tests generally, and for the very success of certain tests, a fresh surface of mercury should engage wafer W in each new test cycle. However, in usual mercury-contact test equipment, dross tends to accumulate at the contact end of the mercury in the tube.

A self-cleaning mercury contact is realized in the apparatus of FIG. 1 by virtue of the vacuum developed in the reservoir that extracts all the mercury from the passage to the test apparatus 17. Any dross that may have entered at aperture 17 tends to float and accumulate in reservoir 20. In each test cycle, mercury stripped of dross is drawn from reservoir 20 and shifted to aperture 17.

For certain tests, it is not important to disconnect the mercury in tubing segment 14a from the rest of the mercury. However, in some tests, it is important to eliminate prominent values of stray capacitance. Even if only one mercury contact is involved, it may be important to minimize stray capacitance by segregating the mercury-probe segment 14a of the passage. In Schottky diode tests, capacitance measurements are made to determine the impurity density as a function of the depletion layer boundary depth. Some stray capacitance can be "zeroed out" in the test circuit. This is readily done with respect to the stray capacitance between the mercury in tube segment 14a and the large-area contact 10. However, a much larger amount of stray capacitance is developed between the large-area contact and the reservoir whenever the reservoir remains connected to the mercury probe segment of tube 14a. That larger stray capacitance is more difficult to "zero out", and it tends to degrade the accuracy of the measurement. Opening of valve 19 after mercury fills tubing segment 14a disconnects the reservoir electrically and eliminates its stray capacitance.

In some tests it may be unnecessary to part the mercury in segment 14a from that in the reservoir. In that case, the vent provision 18, 19 and the vacuum provision 22, 24 could be omitted or it could be disregarded. At the end of the tests, vacuum at groove 30 is interrupted by shutting vacuum valve 26. When that occurs, air can reach aperture 17, allowing the mercury in tubing 14 to return to the reservoir by siphon action. Even if the vacuum line 22 were omitted or not used, the mercury can be self-cleaning, simply by limiting the immersion of tube 14b in the mercury to a depth h discussed below in connection with FIGS. 2 and 2A.

Figure 2:
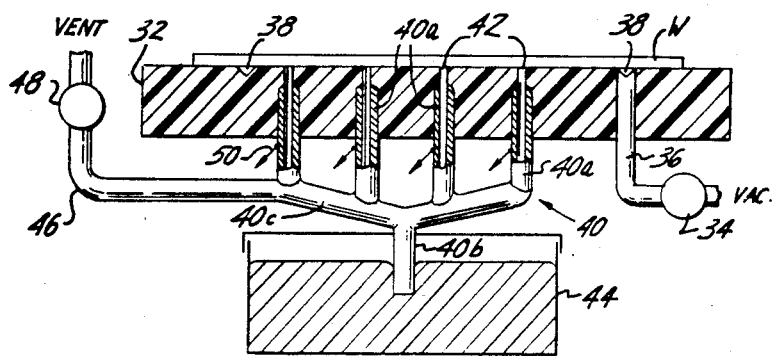
FIGS. 2 and 3 are further embodiments of various features of the invention.
Figure 2A:
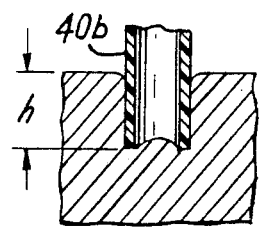

FIG. 2 illustrates mercury probe apparatus that provides a single reservoir serving four mercury contacts. Such four-point-probe contacts enable resistivity measurements to be made by passing current through the wafer between the outermost two mercury-probe contacts and making voltage measurements across the inner two mercury contacts. In other tests, three and even two mercury-probe contacts are used, served by the common reservoir. Indeed, where two mercury-probe contacts are used, as in making Schottky diode tests and whenever stray capacitance is of concern, the apparatus of FIG. 2 has the further advantages discussed above of disconnecting the reservoir and its associated stray capacitance from the mercury that is in the test circuit.

In FIG. 2, wafer W rests on support 32, and is held firmly against the support when vacuum is developed between the wafer and support 32. This occurs when valve 34 in vacuum line 36 is opened, developing vacuum in the circular groove 38. The vacuum develops across the interface between the wafer and plate 32 by virtue of microscopic scratches in the surface of plate 32. Groove 38 surrounds apertures 42 in plate 32.

Four segments of tubing 40a (as in FIG. 1A) extend to apertures 42, to provide four mercury-probe contacts to the wafer. A common length of tubing 40b extends into the mercury reservoir 44. Manifold 40c connects probe segments 40a to each other and to a vent line 46, which is controlled by vent valve 48. Portions 40a, 40b and 40c are collectively identified as tubing 40. Manifold 40c is of electrical insulation.

With valve 48 closed, opening of vacuum valve 34 develops vacuum across the interface of the wafer and plate 32, and vacuum also develops in tubing 40 and vent line 46. Tubing 40 fills with mercury. When tests are to be made, vent valve 48 is opened, allowing the mercury in portions 40b and 40c of the system to drop back into the reservoir. The vacuum is maintained in the interface between the wafer and its support. Therefore the mercury is retained at apertures 42 and in tube segments 40a. There is no problem of the mercury dropping out of apertures 42 and tube segments 40a inasmuch as their diameters are not unduly large.

The desired tests are conducted with vacuum valve 34 open. Opening of vent valve 48 causes discharge of the mercury in manifold 40c, so that tubing segments 40a are electrically disconnected from reservoir 44 and from each other. Suitable test connections 50 are made to tube segments 40a.

When the tests are completed, vacuum valve 34 is closed, the interface between wafer W and plate 32 returns to atmospheric pressure, and the mercury in probe apertures 42 and tube segments 40a drops into the reservoir.

Dross may enter test apertures 42 and would interfere with subsequent tests. The dross can be eliminated automatically in this apparatus by limiting the depth of immersion h of tube 40b in the mercury of the reservoir. While the test apparatus of FIG. 2 includes four probes 40a, 42, this feature is also effective for one or more probes.

The lower end of tubing 40b should be immersed far enough so that, when mercury is withdrawn from the reservoir to fill tubing 40, the mercury in the reservoir does not fall below the opening in the lower end of tube 40b. This is easily arranged. The bore of tubing 40 is made small, so that only a small volume of mercury is needed to fill tubing 40, and the diameter of the reservoir is made appropriately large so that the level of the mercury in the reservoir does not fall excessively in filling the tubing with mercury.

With a limited depth of immersion h (FIG. 2A), surface tension across the tube opening depresses the mercury as shown. During a test, mercury fills tube segments 40a. Following the test, all of that mercury drops into the reservoir. The sudden transfer of the mercury from the tubing into the reservoir tends to carry with it any dross introduced at the contact apertures 42. Once in the reservoir, the dross floats and is captured, as in the apparatus of FIG. 1.

For self-cleaning of the mercury, the depth h of immersion of tube 40b into the mercury in the reservoir before mercury is drawn into tubing 40 should be no greater than about:

$$h = \frac{2S}{\rho g r}$$

where
$\rho$ = density
where
S = surface tension
g = acceleration of gravity
r = radius of the tube.

For mercury, $\rho = 13.5$ and S = 487 dynes/cm; and g = 980 cm/sec$^2$. The above expression for h is derived by noting that the surface tension of the mercury that resists entry of the mercury into the tube is in equilibrium with the buoyant force tending to elevate the mercury into the tube. At equilibrium:

$$S \cdot 2\pi r = \rho \cdot \pi r^2 h g$$

For mercury, S = 487 dynes/cm, and $\rho = 13.5$. Accordingly, $$h = \frac{2 \cdot 487}{13.5 \cdot 980 \cdot r} = \frac{.07362}{r}$$

In an example, where the bore radius of the tube immersed in the mercury of the reservoir is 0.043 cm or 0.0165 inch, h = 1.75 cm = 0.7 inch or 11/16 inch.

This is the theoretical maximum immersion of the tube for dependable self-clearing of dross from the mercury in the apparatus of FIG. 2. The depth h can be determined empirically for any bore diameter simply by using a sample of the tubing and determining the maximum immersion that occurs before mercury rises appreciably into the tube. However, since the transfer of mercury into the reservoir in practice tends to be sudden, this depth may be exceeded slightly.

The passage opening into the reservoir need not be directed downward as shown but, instead, the passage can enter a side wall or even the bottom of the reservoir. Virtually the same limitation on the depth of immersion of the opening in the reservoir applies here for the passage to be self-emptying when the tests are done and sustained equalization of pressure is restored at the contact aperture and at the surface of the mercury in the reservoir. In all configurations of the passage opening into the reservoir (up, down and sidewise) it is presumed that the passage extends to the contact aperture at a higher elevation relative to the reservoir. This normal passage configuration does not extend far (if at all) below the reservoir opening, Not only the entry of the passage into the reservoir, but the whole length of the passage should be disposed not lower than about the level h.

The bore of the tubing that is immersed in the reservoir forms the opening into the reservoir. Accordingly, the end of a column of mercury returning to the reservoir, of limited cross-section, develops the same surface tension as that developed across the opening initially (FIG. 2A). That surface tension of the mercury in the bore produces a self-emptying force. For the passage to be self-emptying (FIG. 2, and FIG. 1 when operated without emptying vacuum), the depth of immersion of the opening in the reservoir is to be limited in relation to the passage-emptying force due to surface tension across the bore of the passage including its opening into the reservoir. Where the contact aperture is much higher than the reservoir, this limitation on the bore's cross-section need not extend above that elevation at which the downward forces in the reservoir to the passage opening are overcome by the passage-emptying forces of the mercury in the tubing due to gravity and surface tension. As already noted, impetus of the mass of mercury in the passage returning toward the reservoir aids in the self-emptying effect.

Figure 3:
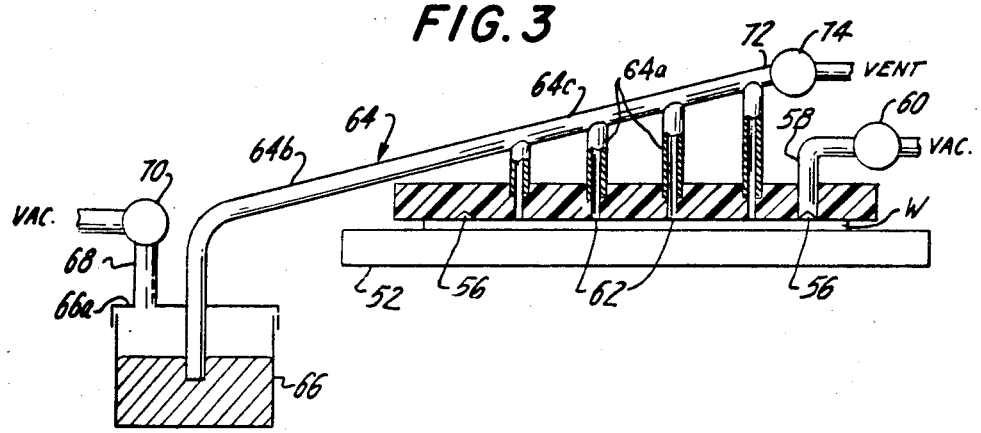

In FIG. 3 as in FIG. 1, contact to the wafer is made from above, and FIG. 3 like FIG. 2 provides multiple mercury-probe contacts that are disconnected from each other and from the reservoir during tests. In FIG. 3, wafer W rests on support plate 52 that may be of insulation or of metal, depending on the tests to be performed.

Plate 54 of electrical insulation has a circular groove 56 connected to vacuum line 58 and vacuum valve 60. Within the circle of groove 56, plate 54 has multiple probe apertures 62 aligned with tube segments 64a of the form in FIG. 1A. A return tube 64b provides a mercury passage from reservoir 66 to tube segments 64a via manifold 64c. Portions 64a, 64b and 64c are collectively identified as tubing 64. Tubing 64c is of electrical insulation. Tube segment 64b extends through a seal in sealed cover 66a of the reservoir. A vacuum line 68 and a vacuum valve 70 (when open) develop vacuum in reservoir 66. A vent line 72 equipped with vent valve 74 extends from manifold 64c.

The sequence of operations in FIG. 3 parallels that of FIG. 1. However, in FIG. 3, the plural mercury-probe segments identified with tubes 64a are disconnected both from the reservoir and from each other when vent valve 74 is opened. At this time, vacuum valve 60 is open and vacuum valve 70 is closed. The apparatus of FIG. 3 thus eliminates the stray capacitance of the reservoir from each and all the mercury-probe contacts, and it operates in a manner that automatically removes dross that may enter the mercury-probe apertures.

In each of FIGS. 1, 2 and 3, the vent valve is said to be either open or closed, at different times in the sequence of operations. However, experience shows that if these valves are nearly closed or if they leak ever so slightly, then there would be no need to manipulate them. In fact, they can be replaced by a length of vent line that has a pin-hole in its end remote from the mercury-probe segments 14a, 40a and 64a. In operation, when vacuum develops in the mercury-probe segments, the mercury-passage fills quickly with mercury. Once mercury fills apertures 17, 42 and 62, the mercury blocks the vent line from the vacuum. Air entering the pin-hole—or the leaky valve 19, 48 and 74—of the vent line can then allow the mercury in the tubing (except that in the mercury-probe segments) to return to the reservoir by siphon action. This slight air leak does not interfere with subsequent operation of each apparatus to withdraw the mercury in mercury-probe segments 14a, 40a and 64a due to gravity or reservoir vacuum.

The illustrative embodiments of the invention shown in the accompanying drawings and described in detail above are subject to various modifications and the novel features may be variously applied by those skilled in the art. Consequently, the invention should be construed broadly in accordance with its full spirit and scope.

I claim:

1. The method of operating mercury probe apparatus of the type having at least one contact aperture in an aperture plate for engagement with a test wafer, a mercury reservoir at an elevation at least largely below the contact aperture, and passage means between said aperture and the reservoir, the passage means having an opening into the reservoir below the upper surface of the mercury therein, the contact aperture being related to said upper surface of the mercury so that the mercury is normally retracted from the contact aperture, said method including the steps of applying a pressure difference between the contact aperture and the upper surface of the mercury in the reservoir for thereby shifting mercury to the contact aperture to form at least one mercury probe contact, electrically testing the wafer, and then causing mercury to descend in the passage means solely by establishing sustained equality of pressure at the contact aperture and at the upper surface of the mercury in the reservoir, said method including the further step of adjusting the relative levels of the upper surface of the mercury in the reservoir and said opening of the passage means into the reservoir so that said opening is immersed no deeper than about the level at which the gravitational force of the mercury in the reservoir at said opening tending to cause mercury to enter the passage means is balanced by the reverse effect of the surface tension of the mercury across said opening, for causing said passage means to be essentially self-emptying.

2. The method of claim 1, wherein the opening of the passage means into the reservoir is circular and wherein the level to which the mercury in the reservoir is adjusted is such that the opening of the passage means is immersed to a depth h not more than about $2 S/\rho g\, r$, where S is the surface tension of mercury, $\rho$ is the density of mercury, g is the acceleration of gravity and r is the radius of the opening.

3. Mercury-probe apparatus including an aperture plate having a contact aperture therein for defining a mercury-probe contact to a test wafer placed against the aperture plate, means including mercury when present in said aperture for forming a test contact to the wafer, a mercury reservoir at least largely below the elevation of the contact aperture, passage means between the aperture and the reservoir, the passage means extending into the reservoir and having an opening below the upper surface of the mercury in the reservoir, the contact aperture and said upper surface being so related that the mercury is normally retracted from said contact aperture, means operable sequentially for developing a pressure difference between said aperture and the upper surface of the mercury in the reservoir for causing mercury to shift to said aperture preparatory to performing tests on the wafer and, after electrical testing of a wafer, for establishing sustained equality of pressure at said contact aperture and said upper surface, said apparatus being of the type that relies solely on establishment of said equality pressure for causing retraction of mercury in the passage means, the immersion of said opening into the reservoir being limited to a depth not greater than about the level at which the gravitational force tending to cause the mercury in the reservoir to enter the passage means due to the depth of immersion of said opening below the surface of the mercury in the reservoir is balanced by the reverse effect of the surface tension of the mercury across said opening, whereby the passage means tends to be essentially self-emptying of mercury when said sustained equality of pressure is established.

4. Mercury-probe apparatus as in claim 3 wherein said reservoir opening is circular and wherein said opening is immersed to a depth h of not more than about $2S/\rho g\, r$, where S is the surface tension of mercury, $\rho$ is the density of mercury, g is the acceleration of gravity, and r is the radius of said opening.

5. Mercury-probe apparatus including an aperture plate having a contact aperture therein for defining a mercury-probe contact to a test wafer placed against the aperture plate, means for providing mercury in said aperture for forming a test contact to the wafer, said mercury providing means including a mercury reservoir at a lower elevation than the contact aperture, passage means between the contact aperture and the reservoir including tubing extending downward and terminating in an opening below the upper surface of the mercury in the reservoir, the contact aperture and said upper surface being so related that the mercury is normally retracted from said contact aperture, means operable sequentially for developing a pressure difference between said contact aperture and the upper surface of the mercury in the reservoir for causing mercury to shift to said aperture preparatory to testing the wafer and, after electrical testing of a wafer, for effecting retraction of the mercury from said aperture by establishing sustained equality of pressure at said contact aperture and at the upper surface of the mercury in the reservoir, said apparatus being of the type that relies solely on gravity and the relationship of the mercury and the passage means to retract the mercury in the passage means, the opening of the tubing into the mercury in the reservoir being limited to a depth not greater than about the level at which the gravitational force tending to cause mercury to enter the tubing from the reservoir is balanced by the reverse effect of the tension of a surface of mercury across the bore of said tubing at said opening.

6. Mercury-probe apparatus as in claim 5, wherein said opening is circular and wherein said opening is immersed to a depth h of not more than about $2S/\rho g\, r$, where S is the surface tension of mercury, $\rho$ is the density of mercury, g is the acceleration of gravity, and r is the radius of said opening.

* * * * *